(12) United States Patent
Meyer et al.

(10) Patent No.: US 9,972,601 B2
(45) Date of Patent: May 15, 2018

(54) INTEGRATED CIRCUIT PACKAGE HAVING WIREBONDED MULTI-DIE STACK

(71) Applicant: INTEL CORPORATION, Santa Clara, CA (US)

(72) Inventors: Thorsten Meyer, Regensburg (DE); Pauli Jaervinen, Wallerfing (DE); Richard Patten, Langquaid (DE)

(73) Assignee: INTEL CORPORATION, Santa Clara, CA (US)

( * ) Notice: Subject to any disclaimer, the term of this patent is extended or adjusted under 35 U.S.C. 154(b) by 0 days. days.

(21) Appl. No.: 14/768,209

(22) PCT Filed: Sep. 26, 2014

(86) PCT No.: PCT/US2014/057781
§ 371 (c)(1),
(2) Date: Aug. 14, 2015

(87) PCT Pub. No.: WO2016/048363
PCT Pub. Date: Mar. 31, 2016

(65) Prior Publication Data
US 2016/0276311 A1    Sep. 22, 2016

(51) Int. Cl.
*H01L 25/065* (2006.01)
*H01L 23/49* (2006.01)
(Continued)

(52) U.S. Cl.
CPC ........ *H01L 25/0657* (2013.01); *H01L 21/568* (2013.01); *H01L 23/3128* (2013.01);
(Continued)

(58) Field of Classification Search
None
See application file for complete search history.

(56) References Cited

U.S. PATENT DOCUMENTS 7,838,337 B2 * 11/2010 Marimuthu .......... H01L 21/565
   257/E21.5
7,989,950 B2 *  8/2011 Park .................... H01L 23/3128
   257/724
(Continued)

FOREIGN PATENT DOCUMENTS

JP    2007251197 A    9/2007
JP    2011187668 A    9/2011
KR    20130015393 A    2/2013

OTHER PUBLICATIONS

Office Action dated Oct. 11, 2016 for Taiwan Patent Application No. 104127511, 8 pages.
(Continued)

*Primary Examiner* — Andres Munoz
(74) *Attorney, Agent, or Firm* — Schwabe, Williamson & Wyatt, P.C.

(57) ABSTRACT

Embodiments of the present disclosure are directed towards an integrated circuit (IC) package including a first die at least partially embedded in a first encapsulation layer and a second die at least partially embedded in a second encapsulation layer. The first die may have a first plurality of die-level interconnect structures disposed at a first side of the first encapsulation layer. The IC package may also include a plurality of electrical routing features at least partially embedded in the first encapsulation layer and configured to route electrical signals between a first and second side of the first encapsulation layer. The second side may be disposed opposite to the first side. The second die may have a second plurality of die-level interconnect structures that may be electrically coupled with at least a subset of the plurality of electrical routing features by bonding wires.

16 Claims, 7 Drawing Sheets

(51) Int. Cl.
  *H01L 25/07* (2006.01)
  *H01L 21/56* (2006.01)
  *H01L 23/00* (2006.01)
  *H01L 23/31* (2006.01)
  *H01L 23/48* (2006.01)
  *H01L 23/528* (2006.01)
  *H01L 25/00* (2006.01)

(52) U.S. Cl.
  CPC ............ *H01L 23/481* (2013.01); *H01L 23/49* (2013.01); *H01L 23/528* (2013.01); *H01L 24/19* (2013.01); *H01L 24/20* (2013.01); *H01L 24/49* (2013.01); *H01L 24/85* (2013.01); *H01L 24/96* (2013.01); *H01L 25/07* (2013.01); *H01L 25/50* (2013.01); *H01L 24/45* (2013.01); *H01L 2224/0401* (2013.01); *H01L 2224/04042* (2013.01); *H01L 2224/04105* (2013.01); *H01L 2224/12105* (2013.01); *H01L 2224/131* (2013.01); *H01L 2224/16227* (2013.01); *H01L 2224/32145* (2013.01); *H01L 2224/32225* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48106* (2013.01); *H01L 2224/48227* (2013.01); *H01L 2224/48228* (2013.01); *H01L 2224/48235* (2013.01); *H01L 2224/73215* (2013.01); *H01L 2224/73265* (2013.01); *H01L 2224/92247* (2013.01); *H01L 2225/0651* (2013.01); *H01L 2225/06548* (2013.01); *H01L 2225/06575* (2013.01); *H01L 2924/00014* (2013.01); *H01L 2924/01028* (2013.01); *H01L 2924/01029* (2013.01); *H01L 2924/01079* (2013.01); *H01L 2924/0665* (2013.01); *H01L 2924/14* (2013.01); *H01L 2924/1579* (2013.01); *H01L 2924/15151* (2013.01); *H01L 2924/15311* (2013.01); *H01L 2924/181* (2013.01)

(56) References Cited

U.S. PATENT DOCUMENTS

| | | | | |
|---|---|---|---|---|
| 8,021,930 B2* | 9/2011 | Pagaila | ............... | H01L 21/561 257/E21.001 |
| 8,354,304 B2* | 1/2013 | Chow | ............... | H01L 21/561 257/774 |
| 8,367,480 B2* | 2/2013 | Pagaila | ............... | H01L 21/561 257/E21.001 |
| 8,462,511 B2* | 6/2013 | Lee | ............... | H01L 25/16 257/686 |
| 8,592,992 B2* | 11/2013 | Lin | ............... | H01L 23/49816 257/678 |
| 8,669,140 B1* | 3/2014 | Muniandy | ............... | H01L 25/105 257/774 |
| 8,810,024 B2* | 8/2014 | Lin | ............... | H01L 23/13 257/621 |
| 8,829,686 B2* | 9/2014 | Hong | ............... | H01L 23/498 257/686 |
| 9,099,460 B2* | 8/2015 | Cho | ............... | H01L 21/565 |
| 9,502,391 B2* | 11/2016 | Kwon | ............... | H01L 24/82 |
| 2003/0164538 A1 | 9/2003 | Matsunami | | |
| 2007/0126122 A1* | 6/2007 | Bauer | ............... | H01L 21/6835 257/774 |
| 2007/0252284 A1 | 11/2007 | Su et al. | | |
| 2008/0211079 A1* | 9/2008 | Onodera | ............... | H01L 25/105 257/686 |
| 2008/0258317 A1* | 10/2008 | Ejima | ............... | H01L 23/3128 257/790 |
| 2009/0243072 A1* | 10/2009 | Ha | ............... | H01L 23/3128 257/686 |
| 2009/0309212 A1 | 12/2009 | Shim et al. | | |
| 2009/0321939 A1 | 12/2009 | Chandrasekaran | | |
| 2010/0032821 A1 | 2/2010 | Pagaila et al. | | |
| 2010/0052131 A1 | 3/2010 | Tay et al. | | |
| 2010/0171205 A1* | 7/2010 | Chen | ............... | H01L 21/565 257/686 |
| 2010/0230823 A1 | 9/2010 | Ihara et al. | | |
| 2011/0068459 A1* | 3/2011 | Pagaila | ............... | H01L 21/568 257/698 |
| 2011/0186977 A1 | 8/2011 | Chi et al. | | |
| 2011/0272807 A1 | 11/2011 | Park et al. | | |
| 2012/0013007 A1 | 1/2012 | Hwang et al. | | |
| 2012/0068319 A1* | 3/2012 | Choi | ............... | H01L 25/16 257/676 |
| 2012/0139090 A1* | 6/2012 | Kim | ............... | H01L 25/16 257/659 |
| 2012/0319294 A1 | 12/2012 | Lee et al. | | |
| 2013/0069245 A1* | 3/2013 | Uchiyama | ............... | H01L 24/24 257/774 |
| 2013/0075926 A1 | 3/2013 | Bae et al. | | |
| 2013/0093097 A1 | 4/2013 | Yu et al. | | |
| 2014/0035935 A1 | 2/2014 | Shenoy et al. | | |
| 2014/0183731 A1 | 7/2014 | Lin et al. | | |

OTHER PUBLICATIONS

Office Action dated Oct. 18, 2016 for Japanese Patent Application No. 2016-550462, 11 pages.
Office Action dated Sep. 23, 2016 for Korean Patent Application No. 2015-7023082, 10 pages.
International Search Report and Written Opinion dated Jun. 26, 2015, issued in corresponding International Application No. PCT/US2014/057781, 15 pages.
Office Action dated Jun. 20, 2016, issued in corresponding Taiwan Patent Application No. 104127511, 30 pages.
Office Action dated May 30, 2017 for Korean Patent Application No. 2015-7023082, 6 pages.
Office Action dated Mar. 30, 2017 for Korean Patent Application No. 2015-7023082, 6 pages.
Office Action dated Mar. 14, 2017 for Japanese Patent Application No. 2016-550462, 14 pages.
Office Action dated Feb. 28, 2018, issued in corresponding Russian Patent Application No. 2017105857, 15 pages.

* cited by examiner

INTEGRATED CIRCUIT PACKAGE HAVING WIREBONDED MULTI-DIE STACK

CROSS-REFERENCE TO RELATED APPLICATION

The present application is a national phase entry under 35 U.S.C. § 371 of International Application No. PCT/US2014/057781, filed Sep. 26, 2014, entitled "INTEGRATED CIRCUIT PACKAGE HAVING WIRE-BONDED MULTI-DIE STACK," which designates the United States of America, the entire disclosure of which is hereby incorporated by reference in its entirety and all purposes.

FIELD

Embodiments of the present disclosure generally relate to the field of integrated circuits, and more particularly, to an integrated circuit package having wire-bonded multi-die stack.

BACKGROUND

The input/output density of dies, such as processors, is continually increasing while dimensions of the dies are shrinking. Providing shorter interconnect distances between dies in a multi-die package and maintaining a small form factor of the multi-die package may be desirable but challenging in view of these advances in technology.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings. Unless clearly indicated otherwise, these drawings are not to scale.

DETAILED DESCRIPTION

Figure 1:
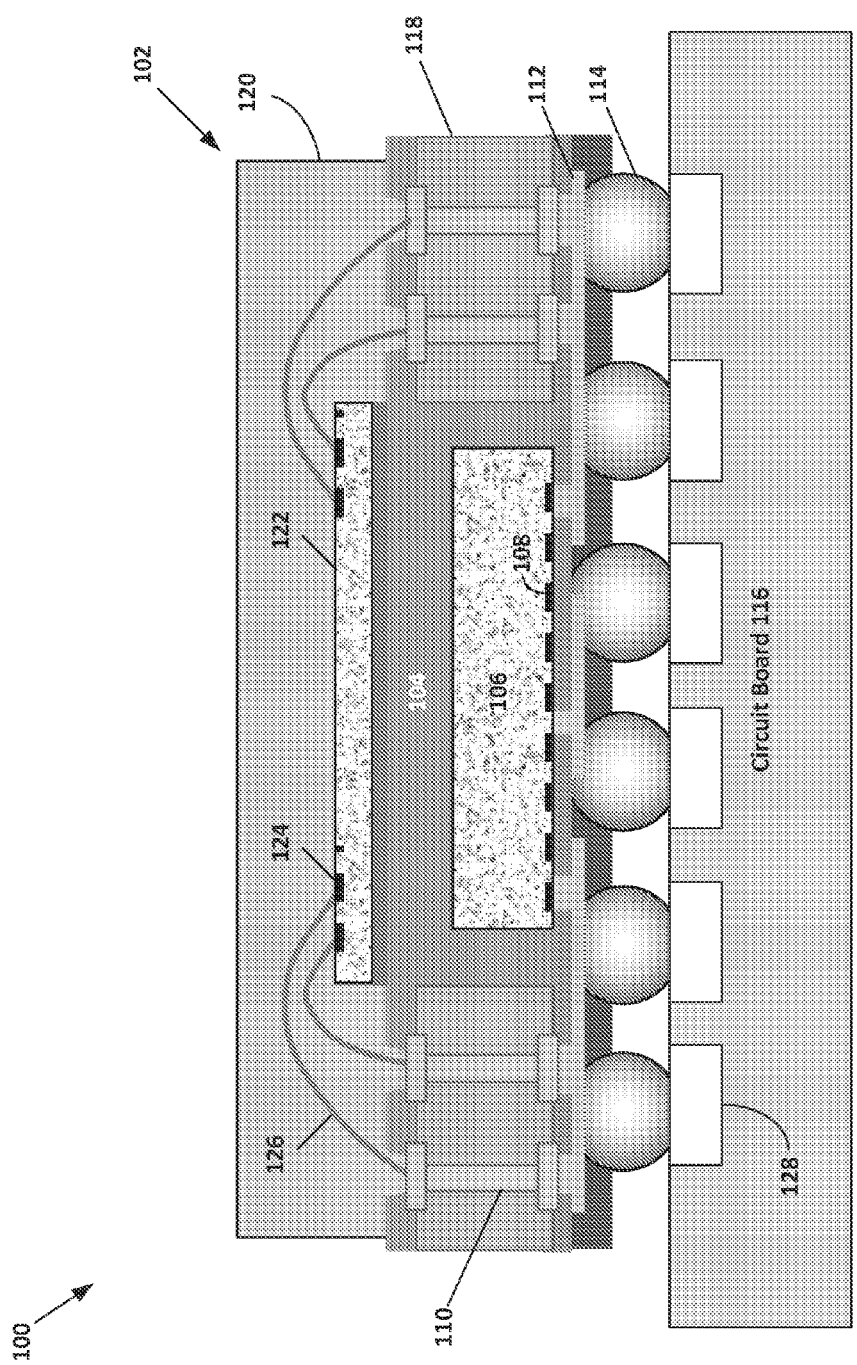
FIG. 1 schematically illustrates a cross-section side view of an example integrated circuit (IC) assembly including an integrated circuit package having a wire-bonded multi-die stack.

Embodiments of the present disclosure describe integrated circuit (IC) package configurations having a wire-bonded multi-die stack. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly including IC package 102 electrically and physically coupled with circuit board 116, in accordance with embodiments of the present disclosure. In embodiments, the IC package 102 may include one or more dies (e.g., first die 106). First die 106 may be at least partially embedded in a first encapsulation layer 104. First die 106 may include a plurality of die-level interconnect structures (e.g., die-level interconnect structure 108) that may be disposed at a first side of first encapsulation layer 104.

IC package 102 may also include a plurality of electrical routing features (e.g., electrical routing feature 110) at least partially embedded in first encapsulation layer 104. The plurality of electrical routing features may be configured to route electrical signals between a second side of first encapsulation layer 104 and the first side of first dielectric layer 104 that is disposed opposite to the second side, as can be seen. In some embodiments, the electrical routing features may, as depicted, be via bars formed in an electrically insulative material (e.g., electrically insulative material 118). Such electrically insulative material may include silicon, ceramic, polymer, or any other suitable material and can be filled or unfilled (e.g. with a silica filler, or other suitable filler).

IC package 102 may further include a second die 122 disposed on the second side of first encapsulation layer 104 and at least partially embedded in a second encapsulation layer 120. The second die 122 may also have a second plurality of die-level interconnect structures (e.g., die-level interconnect structure 124). The second plurality of die-level interconnect structures may be electrically coupled with the electrical routing features by way of bonding wires (e.g., bonding wire 126).

In some embodiments, IC package 102 may have a redistribution layer 112. Redistribution layer 112 may be configured to electrically couple die 106 and die 122, by way of the electrical routing features, with one or more package-level interconnect structures (e.g., solder balls 114). The package-level interconnect structures may be configured to electrically and physically couple IC package 102 with circuit board 116. The IC package 102 may be coupled with circuit board 116 according to a variety of suitable configurations including an elastomer configuration or any other suitable configuration. While depicted herein as solder balls 114, package-level interconnect structures may include pillars, or other suitable structures in place of, or in addition to, solder balls 114 that may electrically couple the IC package 102 with circuit board 116 via one or more pads (e.g., pad 128) disposed in circuit board 116. The IC package 102 may represent a discrete chip made from a semiconductor material and may be, include, or be a part of a processor, memory, or ASIC in some embodiments. In some embodiments, IC package 102 may be an embedded wafer level ball grid array (eWLB) package.

Circuit board 116 may include electrical routing features configured to route electrical signals to or from IC package 102. The electrical routing features may include, for example, traces disposed on one or more surfaces of the circuit board and/or internal routing features such as, for example, trenches, vias or other interconnect structures through which to route electrical signals.

The circuit board 116 may be a printed circuit board (PCB) composed of an electrically insulative material such as an epoxy laminate. For example, the circuit board 116 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. The circuit board 116 may be composed of other suitable materials in other embodiments. In some embodiments, the circuit board 116 may be a motherboard (e.g., motherboard 802 of FIG. 8).

Figure 2:
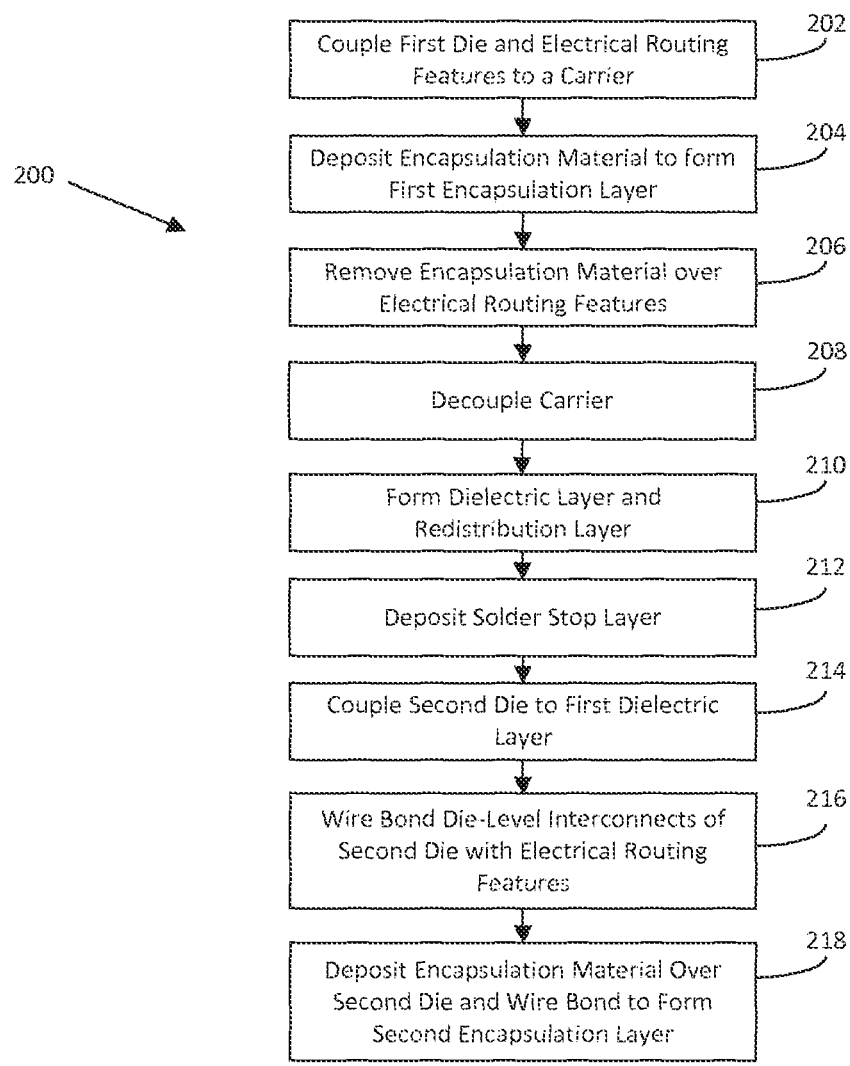
FIG. 2 is an illustrative flow diagram of an integrated circuit package fabrication process in accordance with some embodiments of the present disclosure.
Figure 3:
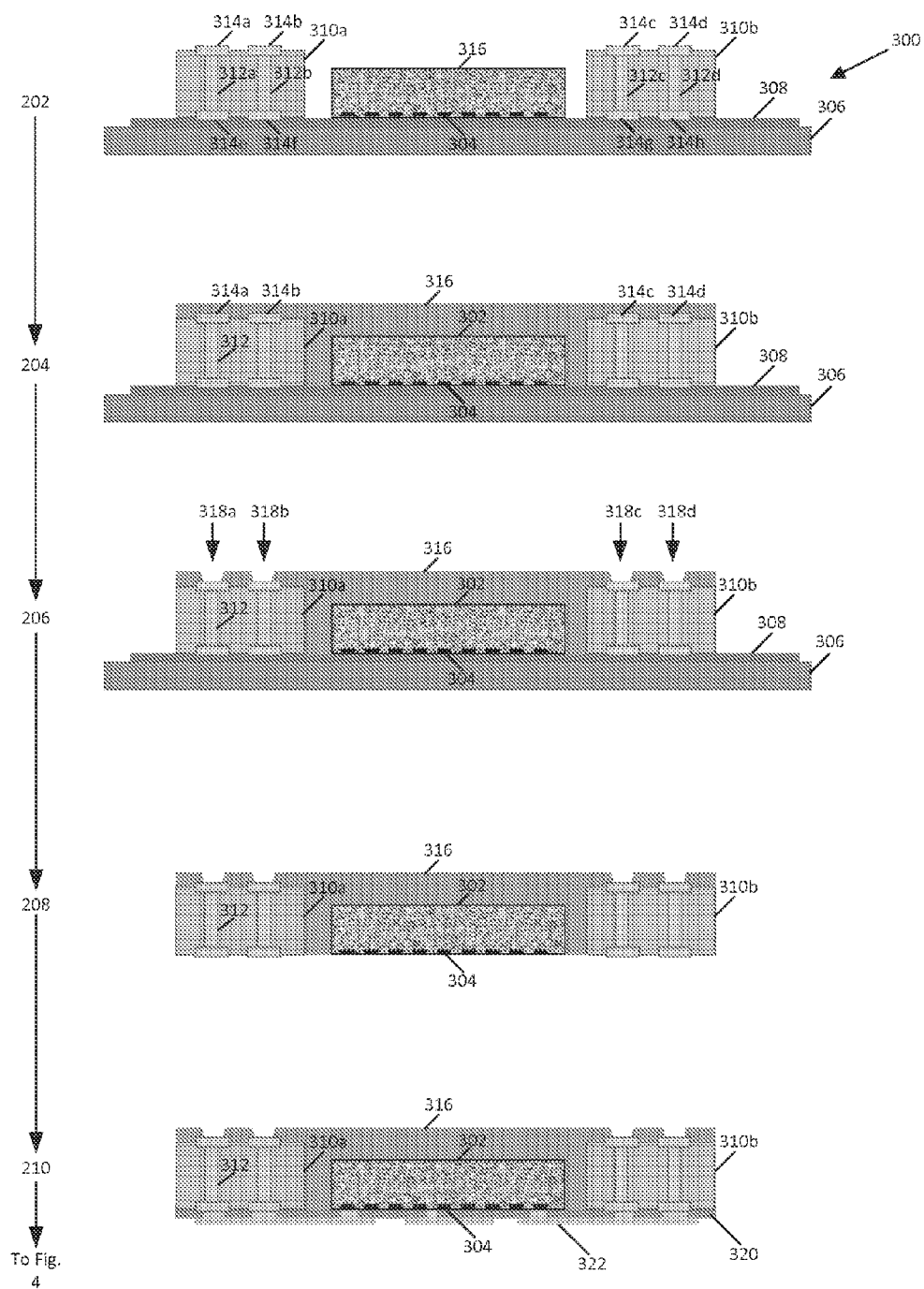
FIGS. 3-4 depict illustrative cross-section side view of selected operations illustrating stages in the integrated circuit package fabrication process described in FIG. 2, in accordance with some embodiments of the present disclosure.
Figure 4:
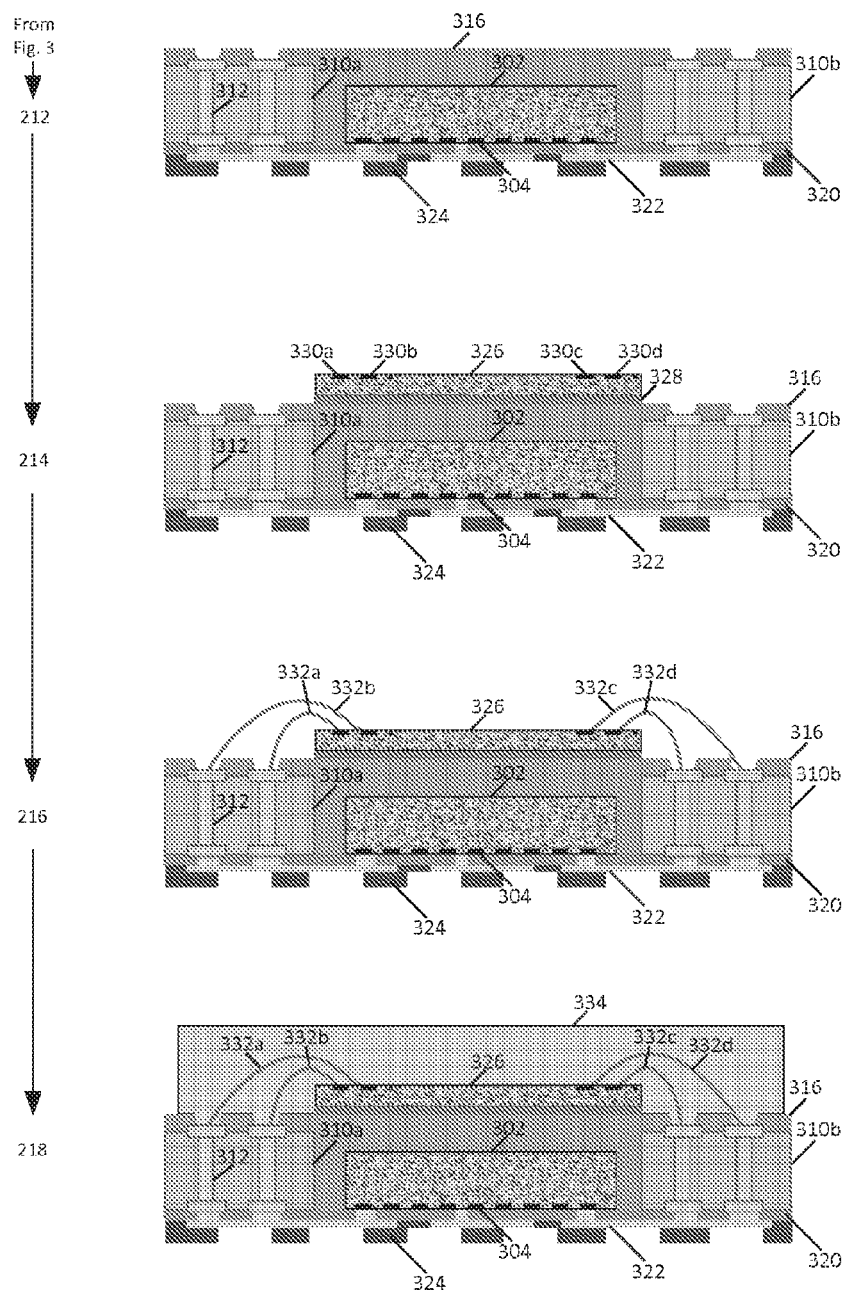

FIG. 2 is an illustrative integrated circuit (IC) package fabrication process 200 for an illustrative IC package (e.g., IC package 102 of FIG. 1) in accordance with various embodiments of the present disclosure. FIGS. 3-4 provide cross-section views of selected operations illustrating stages in IC package fabrication process 200, in accordance with an illustrative embodiment. As a result, FIGS. 2-4 will be described in conjunction with one another. To aid in this description, the operations performed in FIG. 2 are referenced on the arrows moving from operation to operation in FIGS. 3 and 4. In addition, not all reference numbers are depicted in each operation depicted in FIGS. 3 and 4 in an effort to not overly complicate these figures.

IC fabrication process 200 may begin at block 202, where an active side of a first die 302 may be coupled with carrier 306. This may be accomplished through the use of tape or an adhesive (e.g., adhesive 308) disposed on carrier 306. As depicted, the active side of die 302 may have a plurality of die-level interconnect structures (e.g., die level interconnect structure 304) disposed therein. In some embodiments, a plurality of electrical routing features 312a-312d, hereinafter collectively referred to as electrical routing features 312, may also be coupled with carrier 306. In such embodiments, the plurality of electrical routing features may be, as depicted, via bars, made of vias formed in electrically insulative material 310a and 310b. This electrically insulative material may include any suitable material, including, but not limited to, silicon, ceramic, polymer, glass, etc. Electrical routing features may, in some embodiments, have a plurality of bond pads 314a-h disposed at either end of electrical routing features 312a-d. In some embodiments, at least bond pads 314a-d may have a wire-bondable surface finish disposed thereon. Such a wire-bondable surface finish may include, nickel, gold, or any other suitable material or combination of materials. In other embodiments, the electrical routing features may be formed as separate procedures after the formation of first encapsulation layer 316, discussed below in reference to block 204. Electrical routing features may include any electrically conductive material (e.g., copper).

At block 204, a encapsulation material may be deposited to form a first encapsulation layer 316. In some embodiments, such an encapsulation material may be a mold compound (e.g., an epoxy resin). In such embodiments, first encapsulation layer 316 may be formed, for example, through a compression molding process. As depicted, first encapsulation layer 316 may encapsulate at least a portion of first die 302 and electrical routing features 312.

In some embodiments, first encapsulation layer 316 may also encapsulate bond pads 314a-d. In such embodiments, at block 206, any encapsulation material that may have formed over bond pads 314a-d may be removed resulting in voids 318a-d. This may be accomplished by drilling (e.g., laser drilling), grinding, etching, etc. In embodiments that utilize laser drilling, the laser drilling may degrade or destroy a wire-bondable surface finish applied to bond pads 314a-d. In such embodiments, a surface finish (e.g., nickel, gold, or any other suitable surface finish) may be applied after the laser drilling. Such a surface finish may be applied, for example, through an electroless plating process.

At block 208, carrier 306 may be decoupled from first encapsulation layer 316. In some embodiments, the above discussed procedures may be performed separately from the procedures described hereinafter. In such embodiments, the procedure may begin by providing an IC package assembly similar to that produced through the process described above. In such embodiments, a passivation layer may be deposited on the IC package assembly to prevent oxidation or contamination of any exposed metal features, such as bond pads 314a-h and the plurality of die-level interconnects of first die 302. Such a passivation layer may be laminated, printed, or spin-coated, for example. Where such a passivation layer has been applied, voids may be formed in the passivation layer (e.g., through a photolithography process) for the below described procedures At block 210, a dielectric layer 320 may be formed. Such a dielectric layer may be, in some embodiments, the passivation layer discussed above in reference to block 208. In addition a redistribution layer (RDL) 322 may be formed on dielectric layer 320. RDL 320 may provide for signal breakout from the die-level interconnects (e.g., die level interconnect 304) and electrical routing features 312. While depicted herein as a single RDL, it will be appreciated that additional RDLs, and corresponding dielectric layers, may be formed depending on the application and design that the resulting IC package may need to meet. At block 212, moving on to FIG. 4, a solder stop layer 324 may be formed and patterned. Such a solder stop layer may be formed, for example, through a photolithography process.

At block 214, a backside of a second die 326 may be coupled with a second side of first encapsulation layer 316 opposite the RDL 322, as can be seen. This may be accomplished, for example, through the use of tape or an adhesive (e.g. adhesive 328). In embodiments, second die 326 may have a plurality of die-level interconnects 330a-330d disposed thereon. As used herein a backside of a die is a side of the die that does not have die-level interconnects disposed therein.

Figure 5:
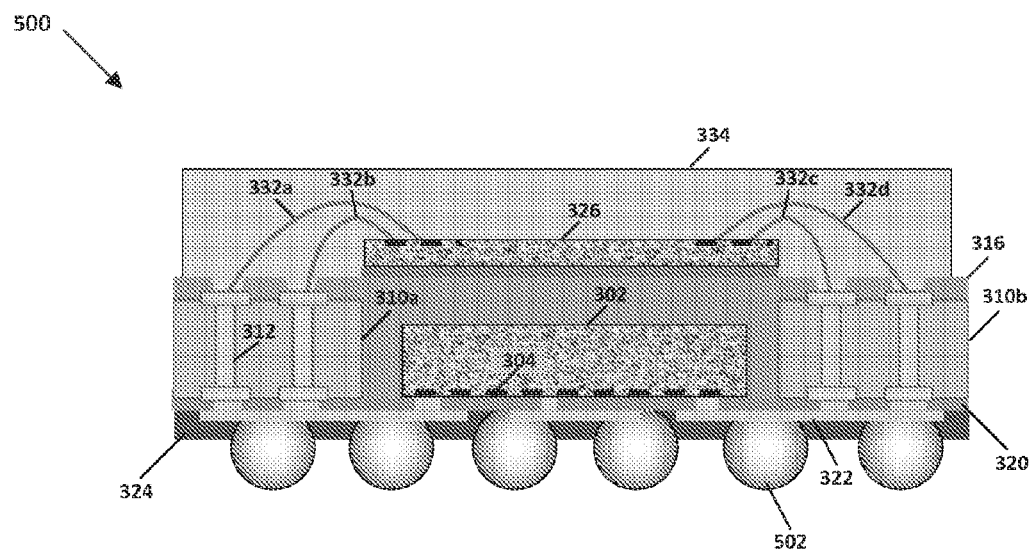
FIG. 5 schematically illustrates a cross-section side view of an example integrated circuit (IC) assembly having package-level interconnect structures, in accordance with various embodiments of the present disclosure.
Figure 6:
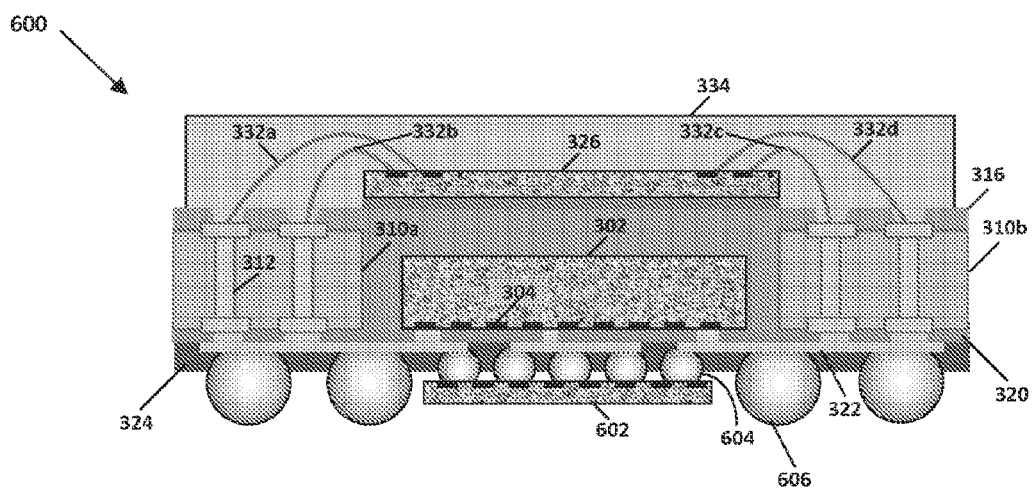
FIG. 6 schematically illustrates a cross-section side view of an example integrated circuit (IC) assembly having package-level interconnect structures and a third die disposed on a redistribution layer (RDL), in accordance with various embodiments of the present disclosure.
Figure 7:
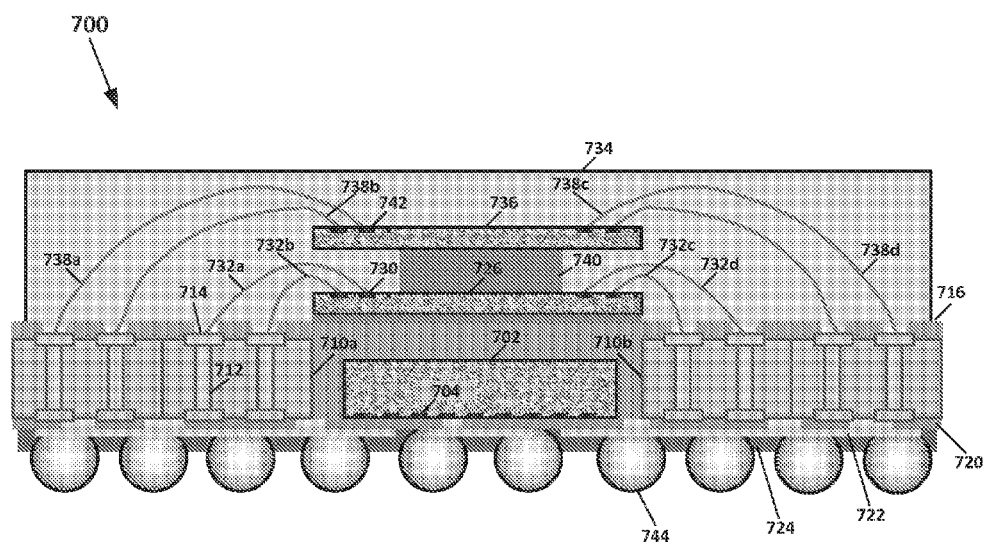
FIG. 7 schematically illustrates a cross-section side view of an example integrated circuit (IC) assembly having an additional die stacked and wire-bonded, in accordance with various embodiments of the present disclosure.

At block 216, die-level interconnects 330a-330d of second die 326 may be wire-bonded via wires 332a-332d, respectively, with electrical routing features 312. Electrical routing features 312 may route electrical signals between second die 326 and the RDL. Wires 332a-d may include any suitable material, including, but not limited to, aluminum, copper, silver, gold, etc., and may also be multi-layer wires (e. g. coated). Such a wire bond may be formed through any conventional wire-bonding process. In some embodiments, one or more additional dies may be stacked on top of second die 326. In such embodiments, a spacer may be placed between each die and a previous die to allow for escape of wires (e.g., wires 332a-d). Such an embodiment is discussed in further detail in reference to FIG. 7, below. At block 218, additional encapsulation material may be deposited over second die 326 and wires 332a-d to form a second encapsulation layer 334 and to protect the wire-bonding configuration. FIGS. 5-7 depict various embodiments of IC packages that may be formed from the above described procedures.

FIG. 5 schematically illustrates a cross-section side view of an example integrated circuit (IC) package 500 having package-level interconnect structures, in accordance with various embodiments of the present disclosure. As depicted, FIG. 5 may take as its starting point, the IC package assembly manufactured through the process described above in reference to FIGS. 2-4. In FIG. 5, however, package-level interconnects (e.g., solder ball 502) may be disposed on the RDL. While depicted herein as solder balls, package-level interconnect structures may include pillars, or other suitable structures in place of, or in addition to, solder balls. These package-level interconnect structures may be configured to electrically couple IC package 500 with a circuit board (e.g., circuit board 116 of FIG. 1).

FIG. 6 schematically illustrates a cross-section side view of an example integrated circuit (IC) package 600 having package-level interconnect structures (e.g., solder ball 606) and a third die 602 incorporated therein, in accordance with various embodiments of the present disclosure. As depicted, FIG. 6 may take as its starting point the IC package assembly manufactured through the process described above in reference to FIGS. 2-4. In FIG. 6, however, package-level interconnects (e.g., solder ball 606) have been disposed on the RDL. In addition a third die 602 has been coupled with the IC package assembly by interconnect structures 604. While depicted herein as solder balls, package-level interconnect structures may include pillars, or other suitable structures in place of, or in addition to, solder balls. These package-level interconnects may be configured to electrically couple IC package 600 and a circuit board (e.g., circuit board 116 of FIG. 1). As can be seen, the combined thickness of the third die 602 and interconnect structures 604 is less than a thickness of the individual package-level interconnect structures. This may enable third die 602 to be located in the same plane as the plurality of package-level interconnect structures.

FIG. 7 schematically illustrates a cross-section side view of an example integrated circuit (IC) package 700 having an additional die 702 stacked on top of die 326. As depicted, IC package 700 may include a first die 702 and a plurality of electrical routing features (e.g., electrical routing feature 712) at least partially embedded in a first encapsulation layer 716. First encapsulation layer 716 may be, for example, a mold compound. In some embodiments, the plurality of electrical routing features may, as depicted, be via bars formed in electrically insulative material 710a and 710b. This electrically insulative material may include any suitable material, including, but not limited to, silicon, ceramic, polymer, etc. Electrical routing features may, in some embodiments, have a plurality of bond pads (e.g., bond pad 714) disposed at either end of the individual electrical routing features. In some embodiments, the top bond pads (e.g., bond pad 714) may have a wire-bondable surface finish disposed thereon. Such a wire-bondable surface finish may include, nickel, gold, or any other suitable material or combination of materials. Electrical routing features may include any electrically conductive material (e.g., copper).

IC package 700 may also include a redistribution layer (RDL) 722. The RDL may be disposed on a dielectric layer 720 and may provide for signal breakout from the die-level interconnects (e.g., die level interconnect 704) and the plurality of electrical routing features (e.g., electrical routing feature 712). While depicted herein as a single RDL, it will be appreciated that additional RDLs, and corresponding dielectric layers, may be formed depending on the application and design that the resulting IC package may need to meet. A solder stop layer 724 may be disposed on the RDL and a plurality of package-level interconnects (e.g., package-level interconnect 744) may be disposed in openings of solder stop layer 724.

IC package 700 may also include a second die 726 that may be coupled with a side of first encapsulation layer 716. This may be accomplished, for example, through the use of tape or an adhesive (e.g. adhesive 728). In embodiments, second die 726 may have a plurality of die-level interconnects (e.g., die-level interconnect 730) disposed thereon. The die-level interconnects of second die 726 may be wire-bonded, as depicted, via wires 732a-732d, with a first subset of the electrical routing features via a corresponding subset of the plurality of bond pads. The electrical routing features may route electrical signals between second die 726 and RDL 722. Wires 732a-d may include any suitable material, including, but not limited to, aluminum, copper, silver, gold, etc. Such a wire bond may be formed through any conventional wire-bonding process. In some embodiments, one or more additional dies (e.g., third die 736) may be stacked on top of second die 726. In such embodiments, a spacer (e.g., spacer 740) may be placed between adjacent dies to allow for escape of wires (e.g., wires 732a-d) from the die below. In embodiments, third die 726 may have a plurality of die-level interconnects (e.g., die-level interconnect 742) disposed thereon. The die-level interconnects of second die 726 may be wire-bonded, as depicted, via wires 738a-738d with a second subset of the electrical routing features via a corresponding second subset of the plurality of bond pads. Second die 726, third die 736 and wires 732a-d and 738a-d may all be embedded in a second encapsulation layer 734. In some embodiments, a fourth die may be coupled with RDL 722 in a similar configuration to that of die 602 of FIG. 6.

Figure 8:
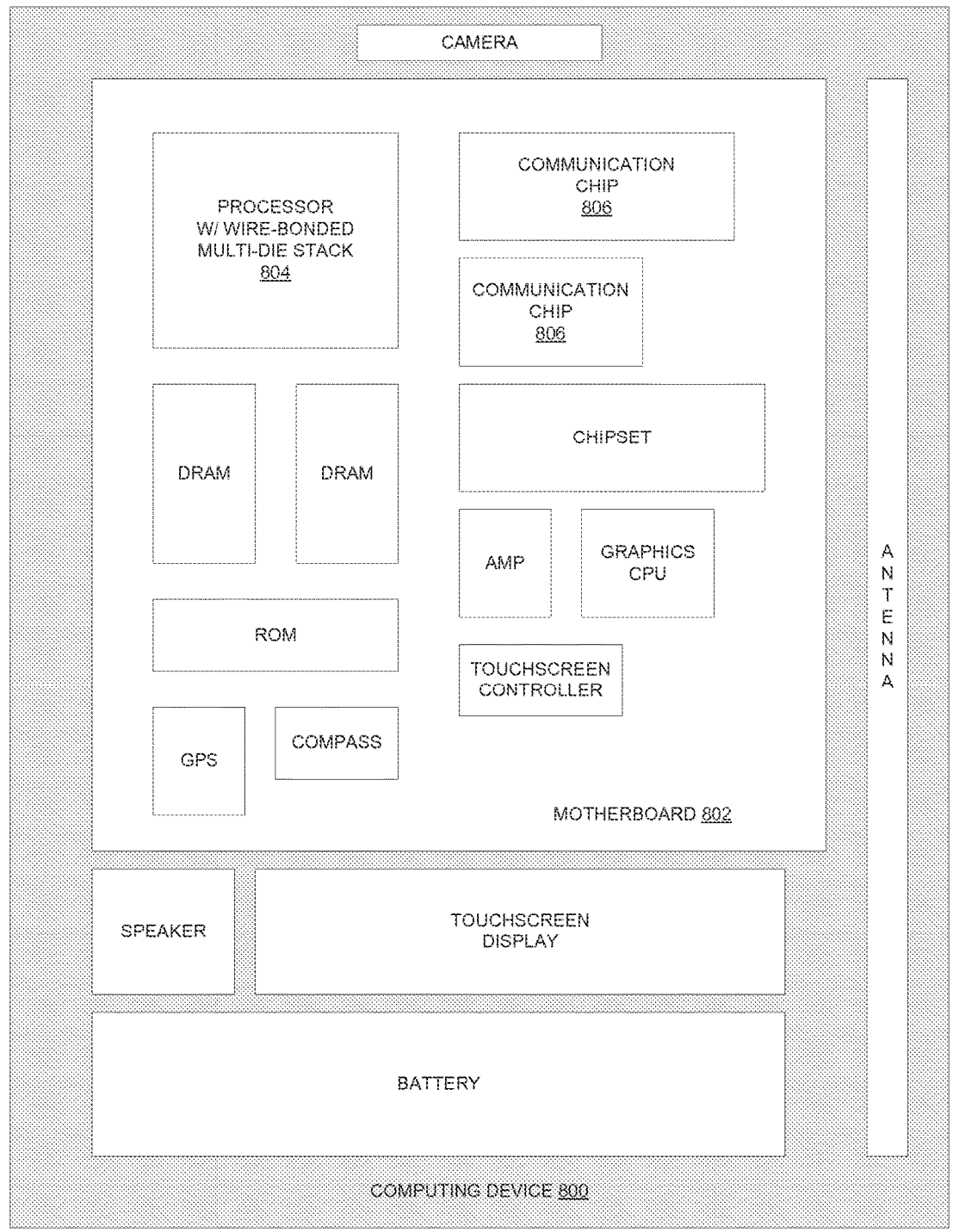
FIG. 8 schematically illustrates a computing device that includes an integrated circuit package, in accordance with some embodiments of the present disclosure.

Embodiments of the present disclosure may be implemented into a system using any suitable hardware and/or software to configure as desired. FIG. 8 schematically illustrates a computing device that includes an IC package as described herein, such as that depicted by FIGS. 1-8. The computing device 800 may house a board such as motherboard 802. The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 may be an IC package (e.g., IC package 102 of FIG. 1) incorporated into an IC assembly. For example, the circuit board 116 of FIG. 1 may be a motherboard 802 and the processor 804 may be a die of an IC package 102 as described herein. The processor 804 and the motherboard 802 may be coupled together using package-level interconnects as described herein. The term "processor" may refer to any device or portion of a device that processes electronic data from registers and/or memory to transform that electronic data into other electronic data that may be stored in registers and/or memory.

The communication chip 806 may be an IC package (e.g., IC package 102) incorporated into an IC assembly that may include a package substrate. In further implementations, another component (e.g., memory device or other integrated circuit device) housed within the computing device 800 may be an IC package (e.g., IC package 102) incorporated into an IC assembly.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

EXAMPLES

According to various embodiments, the present disclosure describes a number of examples. Example 1 may include an integrated circuit (IC) package comprising: a first die at least partially embedded in a first encapsulation layer, the first die having a first plurality of die-level interconnect structures that are disposed at a first side of the first encapsulation layer; a plurality of electrical routing features at least partially embedded in the first encapsulation layer and configured to route electrical signals between the first side of the first encapsulation layer and a second side of the first encapsulation layer that is disposed opposite to the first side; and a second die disposed on the second side of the first encapsulation layer and at least partially embedded in a second encapsulation layer, the second die having a second plurality of die-level interconnect structures, wherein the second plurality of die-level interconnect structures are electrically coupled with at least a subset of the plurality of electrical routing features by bonding wires.

Example 2 may include the subject matter of Example 1, further comprising: one or more redistribution layers (RDLs) disposed on the first side of the first encapsulation layer, wherein the one or more RDLs are electrically coupled with the first die, and wherein the one or more RDLs are electrically coupled with the second die via the plurality of electrical routing features.

Example 3 may include the subject matter of Example 2, further comprising a plurality of package-level interconnect structures disposed on the one or more RDLs.

Example 4 may include the subject matter of Example 2, further comprising a third die disposed on the one or more RDLs and having a third plurality of die-level interconnect structures electrically coupled with the one or more RDLs.

Example 5 may include the subject matter of Example 4, further comprising a plurality of package-level interconnect structures disposed on the one or more RDLs, wherein a combined thickness of the third die and the third plurality of die-level interconnect structures is less than a thickness of the individual package-level interconnect structures of the plurality of package-level interconnects to enable the placement of the third die in a same plane as the plurality of package-level interconnect structures.

Example 6 may include the subject matter of Example 1, wherein the subset of the plurality of electrical routing features is a first subset, the IC package further comprising: a third die at least partially embedded in the second encapsulation layer and having a third plurality of die-level interconnect structures electrically coupled, by bonding wires, with a second subset of the plurality of the electrical routing features, wherein the third die and the second die are coupled together via a spacer.

Example 7 may include the subject matter of any one of Examples 1-6, wherein the plurality of electrical routing features comprise via bars.

Example 8 may include the subject matter of any one of Examples 1-6, wherein the IC package is an embedded wafer level ball grid array (eWLB) package.

Example 9 may include a method of forming an integrated circuit (IC) package comprising: providing a first encapsulation layer having a first die and a plurality of electrical routing features at least partially embedded therein, the first die having a first plurality of die-level interconnect structures that are disposed at a first side of the first encapsulation layer, wherein the electrical routing features electrically couple the first side of the first encapsulation layer with a second side of the first encapsulation layer, and wherein the first side of the first encapsulation layer is disposed opposite the second side of the first encapsulation layer; coupling a second die with a second side of the first encapsulation layer, wherein the second die includes a second plurality of die-level interconnect structures; electrically coupling the second plurality of die-level interconnect structures with at least a subset of the plurality of electrical routing features by bonding wires; and forming a second encapsulation layer over the second die and the wire-bonding configuration to encapsulate at least a portion of the second die and the wire-bonding configuration in the second encapsulation layer.

Example 10 may include the subject matter of Example 9, wherein providing the first encapsulation layer comprises: coupling the first die with a carrier; coupling the plurality of electrical routing features with the carrier; and depositing an encapsulation material over the first die and the plurality of electrical routing features to form the first encapsulation layer.

Example 11 may include the subject matter of Example 9, wherein providing the first encapsulation layer comprises: coupling the first die with a carrier; depositing an encapsulation material over the first die to form the first encapsulation layer; and forming the plurality of electrical routing features in the encapsulation material.

Example 12 may include the subject matter of Example 9, further comprising:

forming one or more redistribution layers (RDLs) on the first side of the first encapsulation layer, wherein the one or more RDLs are electrically coupled with the first die, and wherein the one or more RDLs are electrically coupled with the second die by the plurality of electrical routing features.

Example 13 may include the subject matter of Example 12, further comprising: forming a plurality of package-level interconnects on the one or more RDLs.

Example 14 may include the subject matter of Example 12, further comprising: electrically coupling a third die to the one or more RDLs via a third plurality of die-level interconnect structures disposed on the third die.

Example 15 may include the subject matter of Example 14, further comprising forming a plurality of package-level interconnect structures on the one or more RDLs, wherein a combined thickness of the third die and the third plurality of die-level interconnect structures is less than a thickness of the individual package-level interconnect structures of the plurality of package-level interconnects to enable the placement of the third die in a same plane as the plurality of package-level interconnect structures.

Example 16 may include the subject matter of Example 9, wherein the subset of the plurality of electrical routing features is a first subset and the bonding wires are first bonding wires, the IC package further comprising: physically coupling a third die having a third plurality of die-level interconnect structures to a surface of the second die via a spacer; and electrically coupling the third plurality of die-level interconnect structures with a second subset of the plurality of electrical routing features by second bonding wires, wherein the second encapsulation layer is formed to encapsulate the third die and the Example 17 may include the subject matter of any one of Examples 9-16, wherein the plurality of electrical routing features comprise via bars.

Example 18 may include the subject matter of any one of Examples 9-16, wherein the IC package is an embedded wafer level ball grid array (eWLB) package.

Example 19 may include an integrated circuit (IC) assembly comprising: an IC package including: a first die at least partially embedded in a first encapsulation layer, the first die having a first plurality of die-level interconnect structures that are disposed at a first side of the first encapsulation layer; a plurality of electrical routing features at least partially embedded in the first encapsulation layer and configured to route electrical signals between the first side of the first encapsulation layer and a second side of the first encapsulation layer that is disposed opposite to the first side; a second die disposed on the second side of the first encapsulation layer and at least partially embedded in a second encapsulation layer, the second die having a second plurality of die-level interconnect structures, wherein the second plurality of die-level interconnect structures are electrically coupled with at least a subset of the plurality of electrical routing features by bonding wires; and a plurality of package-level interconnects disposed on the first side of the first encapsulation layer and electrically coupled with the second plurality of die-level interconnect structures, via the plurality of electrical routing features, and the first plurality of die-level interconnect structures; and a circuit board having a plurality of electrical routing features disposed therein and a plurality of pads disposed thereon, wherein the plurality of pads are electrically coupled with the plurality of package-level interconnect structures.

Example 20 may include the subject matter of Example 19, wherein the IC package includes a processor.

Example 21 may include the subject matter of Example 20, further comprising one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Example 22 may include the subject matter of any one of Examples 19-21, wherein the IC assembly is part of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) package comprising:
   a first die at least partially embedded in a first encapsulation layer, the first die having a first plurality of die-level interconnect structures that are disposed at a first side of the first encapsulation layer on a first side of the first die, wherein the first die has a second side opposite the first side;
   a plurality of electrical routing features at least partially embedded in the first encapsulation layer and configured to route electrical signals between the first side of the first encapsulation layer and a second side of the first encapsulation layer that is disposed opposite to the first side;
   an electrically insulative material layer at least partially covered by the first encapsulation layer, wherein the plurality of electrical routing features extend through the electrically insulative material layer; and
   a second die disposed on the second side of the first encapsulation layer and at least partially embedded in a second encapsulation layer, the second die having a second plurality of die-level interconnect structures, wherein the second plurality of die-level interconnect structures are electrically coupled with at least a subset of the plurality of electrical routing features by bonding wires and the second encapsulation layer is in direct contact with the first encapsulation layer, wherein the first encapsulation layer covers the second side of the first die.

2. The IC package of claim 1, further comprising: one or more redistribution layers (RDLs) disposed on the first side of the first encapsulation layer, wherein the one or more RDLs are electrically coupled with the first die, and wherein the one or more RDLs are electrically coupled with the second die via the plurality of electrical routing features.

3. The IC package of claim 2, further comprising a plurality of package-level interconnect structures disposed on the one or more RDLs.

4. The IC package of claim 2, further comprising a third die disposed on the one or more RDLs and having a third plurality of die-level interconnect structures electrically coupled with the one or more RDLs.

5. The IC package of claim 4, further comprising a plurality of package-level interconnect structures disposed on the one or more RDLs, wherein a combined thickness of the third die and the third plurality of die-level interconnect structures is less than a thickness of individual package-level interconnect structures of the plurality of package-level interconnect structures to enable placement of the third die in a same plane as the plurality of package-level interconnect structures.

6. The IC package of claim 1, wherein the subset of the plurality of electrical routing features is a first subset, the IC package further comprising:
a third die at least partially embedded in the second encapsulation layer and having a third plurality of die-level interconnect structures electrically coupled, by bonding wires, with a second subset of the plurality of the electrical routing features, wherein the third die and the second die are coupled together via a spacer.

7. The IC package of claim 1, wherein the plurality of electrical routing features comprise via bars.

8. The IC package of claim 1, wherein the IC package is an embedded wafer level ball grid array (eWLB) package.

9. The IC package of claim 1, further comprising a coupling layer that includes a first side directly coupled with the first encapsulation layer, and a second side opposite the first side that is directly coupled with the second die, wherein the coupling layer is a tape or an adhesive layer.

10. The IC package of claim 1, wherein the bonding wires extend through a plurality of voids in the first encapsulation layer and the second encapsulation layer fills the plurality of voids in the first encapsulation layer.

11. An integrated circuit (IC) assembly comprising:
an IC package including:
a first die at least partially embedded in a first encapsulation layer, the first die having a first plurality of die-level interconnect structures that are disposed at a first side of the first encapsulation layer on a first side of the first die, wherein the first die has a second side opposite the first side;
a plurality of electrical routing features at least partially embedded in the first encapsulation layer and configured to route electrical signals between the first side of the first encapsulation layer and a second side of the first encapsulation layer that is disposed opposite to the first side;
an electrically insulative material layer at least partially covered by the first encapsulation layer, wherein the plurality of electrical routing features extend through the electrically insulative material layer;
a second die disposed on the second side of the first encapsulation layer and at least partially embedded in a second encapsulation layer, the second die having a second plurality of die-level interconnect structures, wherein the second plurality of die-level interconnect structures are electrically coupled with at least a subset of the plurality of electrical routing features by bonding wires and the second encapsulation layer is in direct contact with the first encapsulation layer; and a plurality of package-level interconnect structures disposed on the first side of the first encapsulation layer and electrically coupled with the second plurality of die-level interconnect structures, via the plurality of electrical routing features, and the first plurality of die-level interconnect structures, wherein the first encapsulation layer covers the second side of the first die; and
a circuit board having a plurality of electrical routing features disposed therein and a plurality of pads disposed thereon, wherein the plurality of pads are electrically coupled with the plurality of package-level interconnect structures.

12. The IC assembly of claim 11, wherein the IC package includes a processor.

13. The IC assembly of claim 12, further comprising one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

14. The IC assembly of claim 11, wherein the IC assembly is part of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

15. The IC assembly of claim 11, further comprising a coupling layer that includes a first side directly coupled with the first encapsulation layer, and a second side opposite the first side that is directly coupled with the second die, wherein the coupling layer is a tape or an adhesive layer.

16. The IC assembly of claim 11, wherein the bonding wires extend through a plurality of voids in the first encapsulation layer and the second encapsulation layer fills the plurality of voids in the first encapsulation layer.

* * * * *